(12) United States Patent
Roiz et al.

(10) Patent No.: US 11,012,035 B2
(45) Date of Patent: May 18, 2021

(54) AMPLIFIER DEVICES WITH INPUT TRANSIENT TERMINATION

(71) Applicant: NXP USA, INC., Austin, TX (US)

(72) Inventors: Arturo Roiz, Tempe, AZ (US); Justin Nelson Annes, Chandler, AZ (US); Ricardo Uscola, Tempe, AZ (US); Terry L. Thomas, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 85 days.

(21) Appl. No.: 16/413,433

(22) Filed: May 15, 2019

(65) Prior Publication Data

US 2020/0366244 A1  Nov. 19, 2020

(51) Int. Cl.
*H03F 1/02* (2006.01)
*H03F 3/213* (2006.01)
*H03F 1/56* (2006.01)
*H01L 23/66* (2006.01)

(52) U.S. Cl.
CPC ......... *H03F 1/0205* (2013.01); *H01L 23/66* (2013.01); *H03F 1/56* (2013.01); *H03F 3/213* (2013.01); *H01L 2223/6655* (2013.01); *H01L 2223/6672* (2013.01); *H03F 2200/222* (2013.01); *H03F 2200/387* (2013.01); *H03F 2200/451* (2013.01)

(58) Field of Classification Search
USPC .............. 330/307, 295, 124 R, 302, 305
See application file for complete search history.

(56) References Cited

U.S. PATENT DOCUMENTS

| | | | |
|---|---|---|---|
| 6,670,801 B2 | 12/2003 | Jian et al. | |
| 6,838,989 B1 | 1/2005 | Mays et al. | |
| 7,372,334 B2 | 5/2008 | Blair et al. | |
| 8,164,387 B1 | 4/2012 | Apel et al. | |
| 8,299,856 B2 | 10/2012 | Blair | |
| 8,659,359 B2 * | 2/2014 | Ladhani | H03F 1/42 330/302 |
| 8,896,373 B2 | 11/2014 | Mei | |
| 9,035,715 B2 | 5/2015 | Mei et al. | |
| 9,106,187 B2 | 8/2015 | Ladhani et al. | |
| 9,337,784 B2 | 5/2016 | Kim et al. | |
| 9,762,185 B2 | 9/2017 | Ladhani et al. | |
| 10,243,525 B2 | 3/2019 | Nagasaku | |

(Continued)

OTHER PUBLICATIONS

Jangheon, Kim, et al., "Advanced Design of Linear Doherty Amplifier for High Efficiency using Saturation Amplifier," 2007 IEEE/MTT-S International Microwave Symposium, pp. 1573-1576 (Jun. 2007)(*1-4244-0688-9/07 EEE publication).

(Continued)

*Primary Examiner* — Hieu P Nguyen
(74) *Attorney, Agent, or Firm* — Sherry W. Schumm

(57) ABSTRACT

The embodiments described herein include amplifiers that are typically used in radio frequency (RF) applications. Specifically, the amplifiers described herein include one or more transient termination circuits coupled to transistor inputs. For example, the transient termination circuits can be configured to reduce the transient response for some signal energy at frequencies below a baseband frequency ($f_B$) of signals being amplified while not similarly reducing the transient response for signal energy near a fundamental frequency ($f_0$) of the signals being amplified.

20 Claims, 8 Drawing Sheets

(56) References Cited

U.S. PATENT DOCUMENTS

| | | |
|---|---|---|
| 10,270,402 B1 * | 4/2019 | Holmes .................. H03F 3/195 |
| 10,594,266 B2 | 3/2020 | Krehbiel et al. |
| 10,673,387 B2 | 6/2020 | Srindhi Embar et al. |
| 10,742,174 B2 * | 8/2020 | Roberts .................. H01L 23/66 |
| 2017/0011785 A1 | 1/2017 | Berge et al. |
| 2018/0024135 A1 | 1/2018 | Khandare et al. |
| 2019/0131938 A1 | 5/2019 | Qureshi et al. |

OTHER PUBLICATIONS

U.S. Appl. No. 16/413,484; Non Final Office Action; 8 pages (dated Sep. 30, 2020).
U.S. Appl. No. 16/413,484; Non Final Office Action; 8 pages (dated Jan. 8, 2021).

* cited by examiner

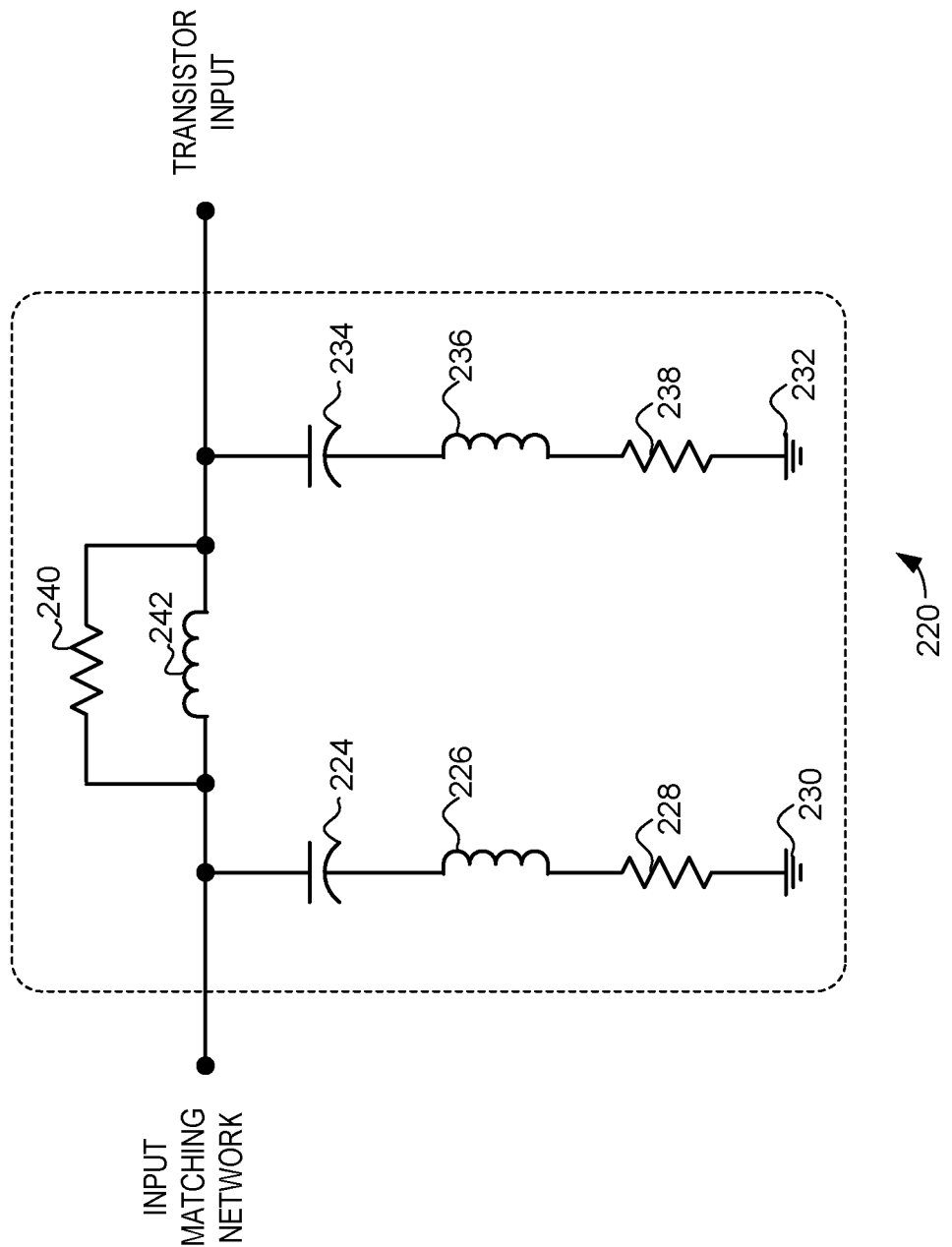

AMPLIFIER DEVICES WITH INPUT TRANSIENT TERMINATION

TECHNICAL FIELD

Embodiments of the subject matter described herein relate generally to amplifiers, and more particularly to radio frequency (RF) power amplifiers used in a variety of applications.

BACKGROUND

In general, amplifiers are used to increase the power of signals. For example, in some applications amplifiers can be used to convert low-power radio frequency (RF) signals into larger RF signals for driving the antenna of a transmitter. In such cases, amplifiers may be implemented as part of an overall power amplifier used by an RF transmission system.

One reoccurring issue in RF power amplifiers is unwanted transient signals that can be caused by noise and other factors. For example, unwanted transient signals can occur at the input of RF power amplifiers. These unwanted transient signals at the input of the RF power amplifier can cause excessive peak transient voltages at the output of the RF power amplifier. In some cases, these excessive peak transient voltages can lead to signal disruption or worse.

Furthermore, some techniques for reducing the possibility of excessive peak transient voltages can undesirably result in reduced amplifier performance. For example, some techniques can impair wideband operation or reduce amplifier linearity, where amplifier linearity is a measurement of how accurate the output signal is compared to the input signal applied to the input of the amplifier, particularly when generating high power signals.

Therefore, there remains a need for amplifiers with reduced susceptibility to excessive peak transient voltages, particularity for high power RF applications.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 2A and 2B are schematic diagrams of transient termination circuits in accordance with example embodiments;

DETAILED DESCRIPTION

The embodiments described herein can provide amplifiers, and particularly radio frequency (RF) power amplifiers, with improved performance. Specifically, the amplifiers described herein include one or more transient termination circuits coupled to one or more transistor inputs. These transient termination circuits can be implemented to mitigate unwanted effects of transient signals at the transistor inputs that could otherwise lead to reduced amplifier performance or worse.

In general, the transient termination circuits are configured to reduce the transient response of certain transient signals while still allowing for high frequency, high power amplification of the operational signals (i.e., the information-bearing signals intended for amplification and transmission). For example, the transient termination circuits can be configured to reduce the transient response for some signals below a baseband frequency ($f_B$) of signals being amplified while not significantly reducing the transient response for signals near a fundamental frequency ($f_O$) of the signals being amplified. Such a selective reduction in the transient response can be implemented by providing a selective increase in the time constant for some signal frequencies while not providing an equivalent increase in time constant for other frequencies. Specifically, a reduction in the transient response for some signals below the baseband frequency ($f_B$) can be accomplished by increasing the time constant applicable to those signals. Conversely, the transient termination circuit can be configured not to significantly increase the time constant for signals near the fundamental frequency ($f_O$). Again, in such a configuration the transient termination circuit can reduce the unwanted effects of transient signals while still providing for high frequency, high power amplification of the operational signals.

For example, the transient termination circuits can reduce the possibility of unwanted transient signals propagating through the transistors and generating high voltage spikes at the transistor output. As such, these transient termination circuits can reduce the possibility of transistor performance degradation that could otherwise result from such high voltage spikes. Finally, such a reduction in potential performance degradation can be provided while still facilitating high frequency amplification in the transistor.

Figure 1:
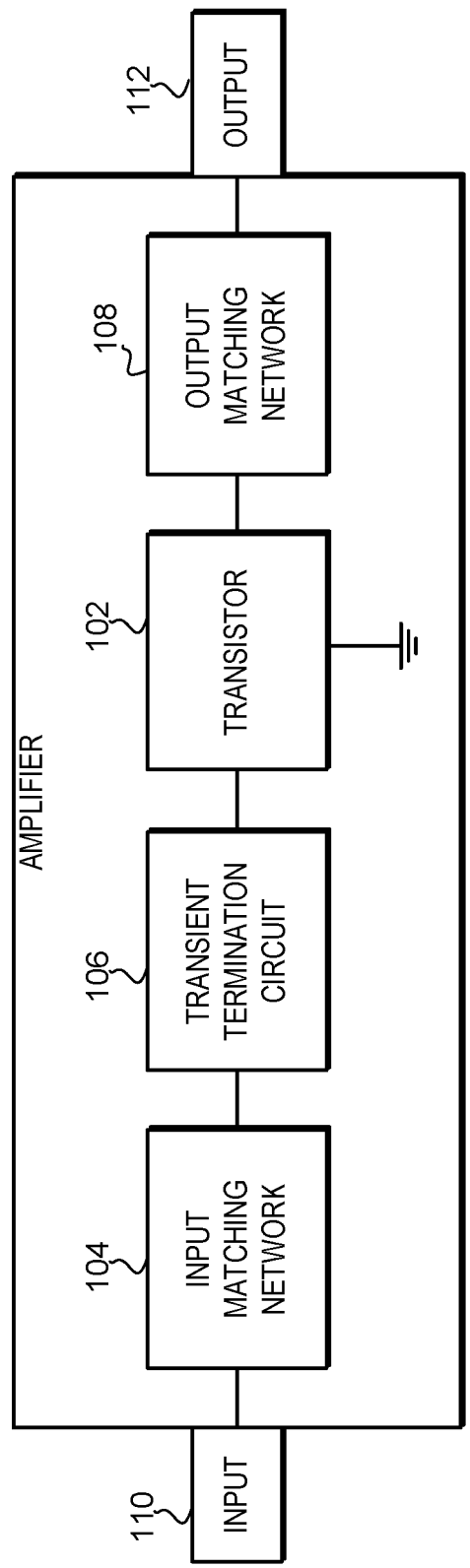
FIG. 1 is a schematic diagram of an amplifier in accordance with an example embodiment.

Turning now to FIG. 1, a schematic diagram of a portion of an exemplary amplifier 100 is illustrated. The amplifier 100 includes a transistor 102, an input matching network 104, a transient termination circuit 106, an output matching network 108, an RF input node 110, and an output load node 112 connected in series as shown. Although transistor 102 is referred to in the singular sense, transistor 102 may include a single-stage transistor, a two-stage transistor (e.g., a series combination of a driver amplifier transistor and a final-stage amplifier transistor), or another transistor/amplifier topology.

The transient termination circuit 106 is coupled to an input of the transistor 102. In general, the transient termination circuit 106 is configured to reduce the transient response of certain transient signals while still allowing for high frequency, high power amplification. For example, the transient termination circuit 106 can be configured to reduce the transient response for some signals below a baseband frequency ($f_B$) while not similarly reducing the transient response for signals near a fundamental frequency of operation of the amplifier ($f_O$). As used herein, the term "near" with respect to a particular frequency (e.g., any of $f_B$, $f_O$, or another frequency) may mean within 20 percent of the particular frequency, for example. Such a reduction in the transient response for some signals below the baseband frequency ($f_B$) can be accomplished by the transient termination circuit 106 increasing the time constant applicable to those signals. However, the transient termination circuit 106 can also be configured not to significantly increase the time constant for signals near the fundamental frequency ($f_O$) and thus not to interfere with high frequency operation of the amplifier 100. Thus, in such a configuration the transient termination circuit 106 can reduce the unwanted effects of transient signals while still providing for high frequency, high power amplification.

In general, it can be desirable to select the amount of increase in the time constant provided by the transient termination circuit 106 based upon the specific details of the amplifier implementation and application. Thus, in typical applications the transient termination circuit 106 can be configured to provide a desired amount of increase in the time constant for that application. In general, the greater the increase in the time constant, the greater protection against the negative effects of transients at the input. However, generally-speaking, the greater the increase in the time constant the greater the effect on high frequency operation of the amplifier. For those reasons embodiments of transient termination circuit 106 are configured to increase the time constant of the transistor input by a factor of between 1.5 and 9 for some signals below the baseband frequency, but not similarly increasing the time constant for signals at the fundamental frequency ($f_O$).

In general, the time constant at a transistor input is a measure of the time it takes for a signal to propagate from the transistor input through the transistor to the transistor output. This propagation time is generally determined in part by the product of the inductances and capacitances at the transistor input (or the "LC product"). The time constant at a transistor input can thus be defined in part by the intrinsic input capacitance and the inductances at the transistor input. For example, the time constant at the input of a packaged field effect transistor (FET) can be substantially equal to the product of the intrinsic gate-source capacitance ($C_{GS}$) and the equivalent internal bonding wire inductance ($L_{BW}$). Thus, a time constant (T) at the input of such a FET can be calculated as T (nanoseconds)=$C_{GS}$ (picofarads)*$L_{BW}$ (nanohenries). In accordance with the embodiments described herein, the transient termination circuit 106 can provide a significant selective increase in the time constant at the input of the transistor 102 for signals having some frequencies. Specifically, the transient termination circuit 106 can be configured to increase the propagation time for at least some signals below the baseband frequency ($f_B$).

In one specific embodiment, the transient termination circuit 106 is configured to reduce the transient response at the transistor input by increasing the time constant at the transistor input by at least a factor of 2 for at least some signals below the baseband frequency ($f_B$), while not increasing the time constant at the transistor input by at least a factor of 2 for signals at the fundamental frequency ($f_O$). In another specific embodiment, the transient termination circuit 106 is configured to reduce the transient response at the transistor input by increasing the time constant at the first transistor input by at least a factor of 7 for at least some signals below the baseband frequency ($f_B$), while not increasing the time constant at the transistor input by at least a factor of 2 for signals at the fundamental frequency ($f_O$). In either case the transient termination circuit 106 provides a selective increase in the time constant for signal energy at some signal frequencies while not providing an equivalent increase in time constant for signal energy at other frequencies.

In one embodiment, the transient termination circuit 106 provides this increase in the time constant at the transistor input for only signals near the baseband frequency ($f_B$). For example, the transient termination circuit 106 can be configured to increase the time constant by the selected amount for signal energy at frequencies between about one third (0.333) of the baseband frequency ($f_B$) and the baseband frequency ($f_B$). In an embodiment where the baseband frequency is on the order of 400 megahertz (MHz), for example, the transient termination circuit 106 could thus be configured to increase the time constant for signals between 0.133 MHz and 400 MHz. In such an embodiment the transient termination circuit 106 could be configured not to increase the time constant at the first transistor input by the same amount for signals near the fundamental frequency ($f_O$). For example, transient termination circuit 106 can be configured not to similarly increase the time constant for signal energy at frequencies between 0.8 $f_O$ and 1.2 $f_O$. Finally, in some embodiments it may also be desirable not to similarly increase the time constant for signals significantly below the baseband frequency ($f_B$). For example, transient termination circuit 106 can be configured not to similarly increase the time constant for signal energy at frequencies less than 0.25 of the baseband frequency ($f_B$). It should be noted these various frequency ranges are merely examples, and that other implementations are possible.

The transient termination circuit 106 can provide this selective increase in time constant in a variety of ways. For example, in one embodiment the transient termination circuit 106 is configured to present a relatively low impedance to signal energy near the baseband frequency ($f_B$), while presenting a relatively high impedance to signal energy at relatively high frequencies (e.g., signal energy at or near the fundamental frequency ($f_O$)). This high impedance of the transient termination circuit 106 may prevent signal energy at the relatively high frequencies from entering the transient termination circuit 106 and being shunted (e.g., to ground) or dissipated by the transient termination circuit 106. Likewise, the transient termination circuit 106 can also be configured to present a relatively high impedance to signal energy at very low frequencies (e.g., signal energy at frequencies significantly below the baseband frequency ($f_B$)). This high impedance of the transient termination circuit 106 may prevent signal energy at the relatively low frequencies from entering the transient termination circuit 106 and being shunted or dissipated by the transient termination circuit 106. Thus, only some signal energy between these relatively high and relatively low frequencies (e.g., signal energy at frequencies near the baseband frequency ($f_B$)) will pass into the transient termination circuit 106 and be shunted or dissipated. And thus, only signal energy at these intermediate frequencies may experience the relatively large increase in effective time constant at the input of the transistor 102.

The transient termination circuit 106 can be implemented to provide this selective increase in the time constant with a variety of different types of devices and circuits. For example, in some embodiments the transient termination circuit 106 can be implemented with one or more resistor-inductor-capacitor (RLC) circuits designed and implemented to provide the desired selective increase in time constant. In such embodiments the inductances of the RLC circuit can present a high impedance to signal energy at relatively high frequencies near the fundamental frequency ($f_O$) while the capacitances of the RLC circuit can present a relatively high impedance to signal energy at relatively low frequencies below the baseband frequency ($f_B$). Finally, for some signal energy at the intermediate frequencies near the baseband frequency ($f_B$) the RLC circuit will resonate and allow that signal energy to be dissipated in the resistors of the RLC circuit and/or shunted, and may thus selectively increase the time constant for that signal energy at the intermediate frequencies.

A variety of different RLC circuits can be used to implement transient termination circuit 106. For example, in some embodiments the transient termination circuit 106 can be implemented with $2^{nd}$ order and higher RLC circuits. In general, a $2^{nd}$ order RLC circuit is one that includes two energy elements, where "energy elements" may include passive elements such as inductors and capacitors. Higher order RLC circuits may include a greater number of energy elements. In each case these RLC circuits would be configured to provide an increase in the time constant at the input of the transistor 102 for some signals below the baseband frequency ($f_B$), while not providing a similar or equivalent increase in the time constant for signals at the fundamental frequency ($f_0$).

Thus, as one example embodiment the transient termination circuit 106 can be implemented to comprise a $2^{nd}$ order low pass equivalent circuit. As a more specific example, the transient termination circuit 106 can comprise a $2^{nd}$ order half-T network, where the half-T network is tuned to increase the time constant of certain signals at the transistor 102 input. Examples of such embodiments will be described with reference to FIG. 2A.

As another example, the transient termination circuit 106 can be implemented to comprise a higher order low pass equivalent circuit. As a more specific example, the transient termination circuit 106 can comprises a Pi-network, where each branch of the Pi-network is tuned to increase the time constant of certain signals at the transistor 102 input. Examples of such embodiments will be described with reference to FIG. 2B.

In each of these cases these $2^{nd}$ order and higher order RLC circuits will include various resistive, capacitive, and inductive elements that are selected and configured to provide the desired increase in the time constant of certain signals at the transistor input, and corresponding decrease in transient response. As was described above, the transient termination circuit 106 can be configured to reduce the transient response for some signal energy at frequencies below a baseband frequency ($f_B$) while not similarly reducing the transient response for signal energy at frequencies near a fundamental frequency ($f_0$). This reduction in the transient response for some signal energy at frequencies below the baseband frequency ($f_B$) can be accomplished by increasing the time constant applicable to those signals. Stated another way, the transient termination circuit 106 can be considered to provide a dampening of the transient signals at the input of the amplifier 100. In some embodiments this can be accomplished by decreasing the circuit dissipation factor ratio R/2L at the transistor input while also increasing the effective LC product at the transistor input, where these R, L and C values are determined at least in part by the intrinsic capacitances, inductances, and resistances at the transistor input. For example, where the transistor 102 is a FET, the intrinsic input capacitance C is determined at least in part by the internal intrinsic gate-source capacitance ($C_{GS}$), and L will be determined at least in part by the input inductance, including any internal input bonding wires in the package with the transistor plus any external inductance at the transistor input. In such an embodiment the circuit dissipation factor ratio R/2L can be effectively decreased by increasing L and decreasing R through the use of the transient termination circuit 106. This decrease of the circuit dissipation factor ratio R/2L and increase of the effective LC product provides an increase in dampening for signal energy at frequencies below the baseband frequency ($f_B$). Thus, the transient termination circuit 106 can effectively increase the time constant applicable to that signal energy, and decrease the transient response for such signal energy.

In a typical embodiment the transistor 102 is formed on a first transistor die and is encased in a device package that includes at least a first input lead and a first output lead. In such an embodiment the transient termination circuit 106 can include at least a first inductance and at least a first capacitance, where at least the first capacitance may be formed on an integrated passive device (IPD) die. In such an embodiment the IPD die can be encased inside the device package with the first transistor die.

In yet other embodiments, the transient termination circuit 106 can include at least a first inductance and at least a first capacitance, where at least the first capacitance is coupled to a first conductive input trace, where the first conductive input trace is implemented on a substrate (e.g., a printed circuit board (PCB)) to which a device package (encasing the transistor die) is mounted, and the first conductive input trace is coupled to the first input lead of the device package. Examples of such embodiments will be described with reference to FIGS. 3A and 3B.

As noted above, the transient termination circuit 106 is coupled to the input of the transistor 102. For example, the transient termination circuit 106 can be coupled to the input or control terminal (e.g., a gate terminal or base terminal) of the transistor 102. In some embodiments it may be desirable to include a DC blocking capacitor before the transient termination circuit 106 (e.g., between the input matching network 104 and the transient termination circuit 106). Such a DC blocking capacitor can be provided to isolate DC voltages from the RF source signal.

The transistor 102 can be implemented with a variety of different types of transistors, including field effect transistors (FETs) and bipolar junction transistors (BJTs), to give two non-limiting examples. In one specific embodiment, the transistor 102 comprises a gallium nitride (GaN) field-effect transistor (FET). As more specific examples, various III-V field effect transistors may be used (e.g., a high electron mobility transistor (HEMT)), such as a GaN FET (or another type of III-V transistor, including a gallium arsenide (GaAs) FET, a gallium phosphide (GaP) FET, an indium phosphide (InP) FET, or an indium antimonide (InSb) FET). In other examples the transistor 102 may be implemented with a III-V FET or with a silicon-based FET (e.g., a laterally-diffused metal oxide semiconductor (LDMOS) FET). In each of these cases the transient termination circuit 106 is coupled to the input of the transistor 102 and is configured to increase the time constant at the input for certain signal energy.

It should be noted that amplifier 100 is a simplified representation of a portion of an amplifier, and in a more typical implementation the amplifier 100 would include additional features not illustrated in FIG. 1. For example, the amplifier 100 could include a variety of bias circuits. As other examples, the amplifier 100 could include additional transistors 102. Additionally, in some embodiments the amplifier 100 could include additional amplification paths, with each path including at least an additional transient termination circuit 106 and transistor 102. Furthermore, the amplifier 100 could be implemented as a variety of different types of amplifiers, including class AB amplifiers. As specific examples, the amplifier 100 can be implemented as a single path class AB amplifier.

In other examples, the amplifier 100 can be implemented as multi-path Doherty amplifiers that use a combination of class AB and class C paths. In such an embodiment the transistor 102 can be implemented as a carrier transistor, and a second transistor 102 can be implemented as a peaking transistor. In such an amplifier a second transient termination circuit 106 can be implemented where the second transient termination circuit is configured to reduce the transient response at the second transistor input by increasing the time constant at the second transistor input by at least a factor of 2 for at least some signal energy at frequencies below the baseband frequency while not increasing the time constant at the second transistor input by at least a factor of 2 for signal energy at frequencies at the fundamental frequency ($f_O$). An example of such an embodiment will be discussed in greater detail with reference to FIG. 5.

Figure 2A:
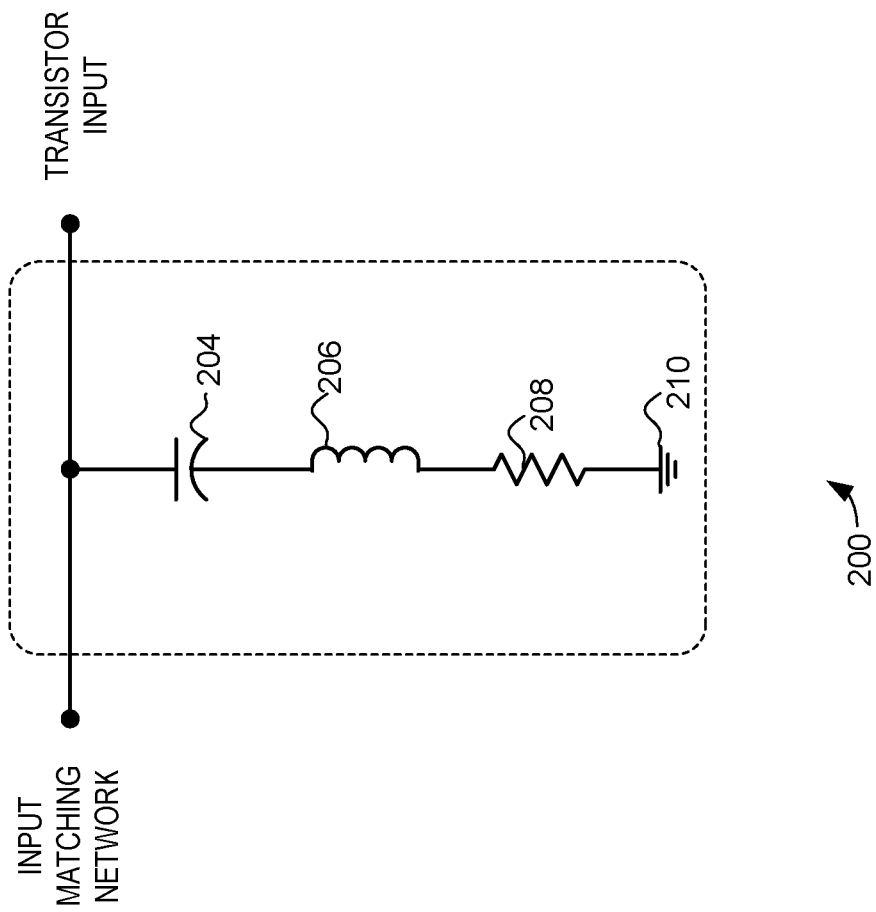

As noted above, a variety of different types of circuits can be implemented as transient termination circuits, including both $2^{nd}$ order and higher order circuits. In one example embodiment, the transient termination circuit 106 can be implemented to comprise a $2^{nd}$ order low pass equivalent circuit. Turning now to FIG. 2A, an exemplary transient termination circuit 200 is illustrated. In general, the transient termination circuit 200 is configured to be coupled between a ground node 210 and a second node located between an input matching network and the transistor input. So implemented, the transient termination circuit 200 can increase the time constant of at the transistor input for selected signal energy to reduce the unwanted effects of transient signals.

The transient termination circuit 200 includes a capacitive element 204, an inductive element 206, and a resistive element 208, where an "element" may include a single component or a network of components. Specifically, the capacitive element 204, inductive element 206, and resistive element 208 are connected in series between the transistor input and a ground node 210. As such, the transient termination circuit is an RLC circuit, and more specifically a $2^{nd}$ order half-T network. This $2^{nd}$ order half-T network can be configured to increase the time constant of the transistor input for selected signal energy while still allowing high frequency operation. For example, by selecting appropriate values for the capacitive element 204, the inductive element 206 and the resistive element 208, the transient termination circuit 200 can be configured to reduce the transient response for some signal energy at frequencies below a baseband frequency ($f_B$) while not similarly reducing the transient response for signal energy at frequencies near a fundamental frequency ($f_O$). In one specific embodiment, the transient termination circuit 200 is configured to reduce the transient response at the first transistor input by increasing the time constant at the first transistor input by at least a factor of 2 for at least some signal energy at frequencies below the baseband frequency ($f_B$), while not increasing the time constant at the first transistor input by at least a factor of 2 for signal energy at frequencies at the fundamental frequency ($f_O$).

As one example, the appropriate values for the capacitive element 204, the inductive element 206 and the resistive element 208 are selected to provide the desired increase in the time constant based on the amount of transient suppression needed for adequate protection of the amplifier. For example, when the fundamental frequency of operation of the amplifier is between about 800 megahertz (MHz) and about 6.0 gigahertz (GHz), a capacitance value of the capacitive element 204 may be in a range of about 1 nanofarads (nF) to about 10 nF, an inductance value of the inductive element 206 may be in a range of about 5 nanohenries (nH) to about 15 nH, and the resistance value of the resistive element 208 may be in a range of about 1.5 ohms to about 3.9 ohms. In other embodiments, the capacitive, inductive, and/or resistive values may be smaller or larger than the above-listed ranges. In addition, the fundamental frequency of operation may be less than 800 MHz or greater than 6.0 GHz. In general, the more protection needed, the greater the increase in time constant that it is desirable to provide with the transient termination circuit 200. Furthermore, RF input signals with fast rising/falling edges are more likely to induce transitory peak voltage events, and thus amplifiers that amplify such signals may need stronger transient protections. With those considerations taken into account, the appropriate values of the capacitive element 204, the inductive element 206 and the resistive element 208 can be selected based in part on the amount of protection needed and the expected RF input signal characteristics. Specifically, it is generally desirable for the resulting time constant of the amplifier input to be higher than the expected RF input signal rise/fall characteristics. For example, if the RF input signals rise/fall on the order of ~1 nanosecond, then the resulting time constant at the amplifier input should be higher and on the order of ~5 nanoseconds to slow the total rise/fall time of the RF input signal.

It should be noted that transient termination circuit 200 is just one example of the type of $2^{nd}$ order low pass equivalent circuit that can be used. For example, although the capacitive, inductive, and resistive elements 204, 206, 208 are shown in a particular order in FIG. 2A (i.e., C-L-R), these elements may be arranged in different orders, in other embodiments (e.g., C-R-L, L-C-R, L-R-C, R-C-L, or R-L-C), and/or some or all of any of these elements may be implemented using multiple components arranged in various orders with both series- and/or parallel-connected components (e.g., C-L-C-R-L-R, to name just one example). As used herein, the term "RLC" circuit means a circuit that includes any arrangement of resistive, inductive, and capacitive components between two nodes.

In another example embodiment, the transient termination circuit 106 of FIG. 1 can be implemented with a higher order low pass equivalent circuit. Turning now to FIG. 2B, an exemplary transient termination circuit 220 is illustrated. Again, the transient termination circuit 220 is configured to be coupled between ground nodes 230, 232, a first node coupled to an input matching network, and a second node coupled to the transistor input, and is implemented to increase the time constant at the transistor input for selected signal energy to reduce the unwanted effects of transient signals.

The transient termination circuit 220 includes capacitive elements 224, 234, inductive elements 226, 236, 242 and resistive elements 228, 238, 240. Specifically, the capacitive element 224, inductive element 226, and resistive element 228 are included in a first branch (or leg) of a Pi network, and are specifically connected in series (in any order) between a first node connected to the input matching network and a ground node 230. Similarly, the capacitive element 234, inductive element 236, and resistive element 238 are included in a second branch (or leg) of the Pi network, and are specifically connected in series (in any order) between a second node connected to the transistor input and a ground node 232. Finally, the resistive element 240 and the inductive element 242 are connected in parallel between the two branches (or between the first and second nodes) to form the Pi network. So implemented, the transient termination circuit 220 is a $4^{th}$ order Pi network. This Pi network can again be configured to increase the time constant at the transistor input for selected signal energy while still allowing high frequency operation. For example, by selecting appropriate values for the capacitive, inductive, and resistive elements, the transient termination circuit 220 can be configured to reduce the transient response for some signal energy at frequencies below a baseband frequency ($f_B$) while not similarly reducing the transient response for signal energy at frequencies at or near a fundamental frequency ($f_0$). In one specific embodiment, the transient termination circuit 200 is configured to reduce the transient response at the first transistor input by increasing the time constant at the first transistor input by at least a factor of 2 for at least some signal energy at frequencies below the baseband frequency ($f_B$), while not increasing the time constant at the first transistor input by at least a factor of 2 for signal energy at frequencies at the fundamental frequency ($f_0$).

Again, the appropriate values for the capacitive elements, inductive elements, and the resistive elements are selected to provide the desired increase in the time constant based on the amount of transient suppression needed for adequate protection of the amplifier and in light of the expected RF input signals. For example, when the fundamental frequency of operation of the amplifier is between about 800 MHz and about 6.0 GHz, a capacitance value of the capacitive element 224 may be in a range of about 1 nF to about 10 nF, a capacitance value of the capacitive element 234 may be in a range of about 1 nF to about 10 nF, an inductance value of the inductive element 226 may be in a range of about 5 nH to about 15 nH, an inductance value of the inductive element 236 may be in a range of about 5 nH to about 15 nH, an inductance value of the inductive element 242 may be in a range of about 47 nH to about 100 nH, the resistance value of the resistive element 228 may be in a range of about 2 ohm to about 6 ohms, the resistance value of the resistive element 238 may be in a range of about 2 ohms to about 6 ohms, and the resistance value of the resistive element 240 may be in a range of about 0.5 ohms to about 3 ohms. In other embodiments, the capacitive, inductive, and/or resistive values may be smaller or larger than the above-listed ranges. In addition, the fundamental frequency of operation may be less than 800 MHz or greater than 6.0 GHz.

It should also be noted that transient termination circuit 220 is just one example of the type of higher order low pass equivalent circuit that can be used. For example, although the capacitive, inductive, and resistive elements in the first and second branches of the Pi network are shown in particular orders in FIG. 2B (i.e., C-L-R), these elements may be arranged in different orders, in other embodiments (e.g., C-R-L, L-C-R, L-R-C, R-C-L, or R-L-C), and/or some or all of any of these elements may be implemented using multiple components arranged in various orders with both series- and/or parallel-connected components (e.g., C-L-C-R-L-R, to name just one example).

Returning to FIG. 1, in general it is desirable to position the transient termination circuit 106 as physically close as possible to the input of the transistor 102. Specifically, it is generally desirable for the transient termination circuit 106 to be physically close to the intrinsic input capacitance of the transistor 102 (e.g., an intrinsic gate-source capacitance $C_{GS}$ where the transistor 102 is a FET). Locating the transient termination circuit 106 relatively far away from the intrinsic input capacitance could allow undesirable parasitic build up and loading the high frequency portion of the transient termination circuit 106. A variety of different techniques and structures can be use to implement the transient termination circuit 106 in a way that facilitates this close physical proximity to the intrinsic input capacitance of the transistor 102.

As noted above, the transistor 102 is typically formed on a transistor die (i.e. a semiconductor die that includes the transistor), where the transistor die is then encased in a device package that includes one or more input leads and output leads. The device package that includes the transistor 102 can then be mounted on a substrate (e., a PCB or other substrate). When mounted on a PCB, the PCB typically includes one or more conductive traces on or below the surface of the PCB, such as conductive input traces used to provide the electrical coupling to the input of the transistor 102, and conductive output traces used to provide the electrically coupling to the output of the transistor 102. Thus, when the transistor 102 device package is mounted to the PCB, the input lead(s) are electrically coupled to the conductive input traces on the PCB, and the output lead(s) are electrically coupled to the conductive output traces on the PCB.

In some embodiments, the transient termination circuit 106 can be incorporated with the conductive input traces on the substrate (e.g., the PCB) to provide a close proximity between the transient termination circuit 106 and the input of the transistor 102. In such embodiments the resistive, capacitive and inductive elements that implement the transient termination circuit 106 can be formed on or attached to the PCB in close proximity to the transistor 102. For example, one or more packaged resistors, capacitors and inductors can be mounted on the PCB in a way that connects those elements to each other and to the input traces in close proximity to the input of the transistor 102. In other embodiments the resistive, capacitive and inductive elements can be formed from one or more additional conductive traces on the PCB, where those additional traces are again in close proximity to the input of the transistor 102.

Figure 3A:
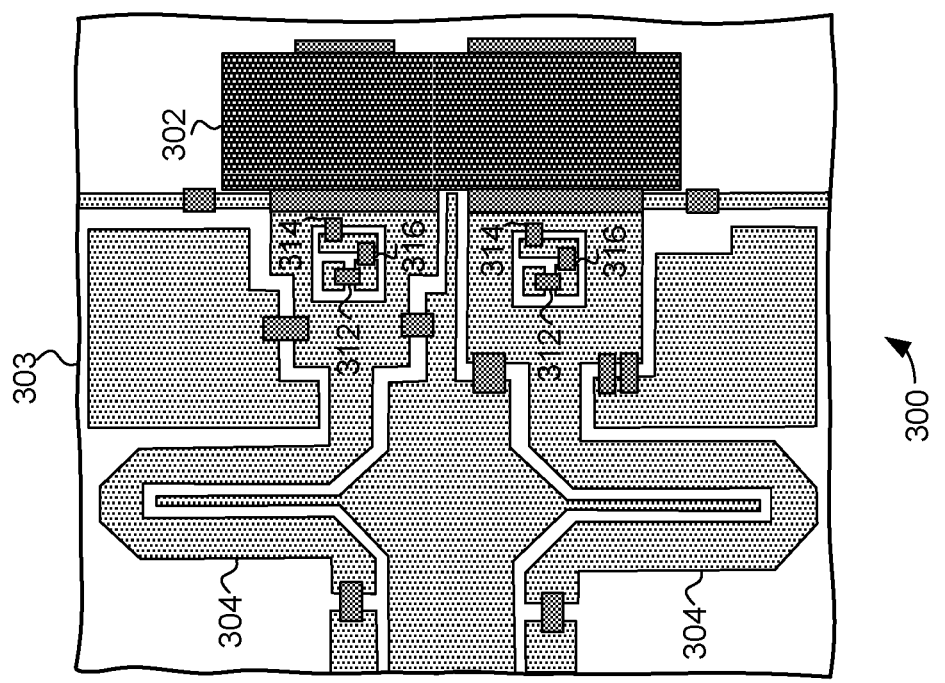
FIGS. 3A and 3B are top views of portions of an amplifier in accordance with example embodiments.

Turning now to FIG. 3A, a top view of a portion of an amplifier 300 is illustrated. The amplifier 300 includes a packaged transistor device 302 mounted to a printed circuit board 303 (PCB). In this embodiment the packaged transistor device 302 includes two encased transistors, two input leads (on the left side of the device 302), and two output leads (on the right side of the device 302. Each encased transistor has its own input (i.e., the two encased transistors are implemented in parallel with each other, each connected between a different input/output lead). The PCB 303 includes a plurality of conductive traces, including two input traces 304. Each of the two input traces 304 provides an electrical connection to the input of a corresponding transistor in the packaged transistor device 302. Specifically, each of the two input traces is coupled to a different input lead of the packaged transistor device 302.

In accordance with the embodiments described herein, a transient termination circuit is coupled to the input of each of the transistors in the packaged transistor device 302. In this embodiment, each of the transient termination circuits is an RLC circuit, and more specifically a $2^{nd}$ order half-T network. In this case, each of the transient termination circuits includes a resistive element 312 (e.g., resistive element 208), a capacitive element 314 (e.g., capacitive element 204), and an inductive element 316 (e.g., inductive element 206). In this particular embodiment each of the resistive element 312, capacitive element 314, and inductive element 316 are formed as separate devices (e.g., surface mount devices) that are mounted to the circuit board 303. More specifically, first and second terminals of each element 312, 314, 316 are connected (e.g., soldered or conductively adhered) to conductive traces on the top surface of circuit board 303, and one of the conductive traces is coupled to a ground reference node (e.g., ground 210) at a bottom surface of the circuit board 303 through conductive vias that extend between the top and bottom surfaces of the circuit board 303. Accordingly, the elements 312, 314, 316 are connected in series between conductive trace 304 and the ground reference node. However, in other embodiments one or more of these elements could be made from conductive traces or in some other manner. Further, the resistive, capacitive, and inductive elements 312, 314, 316 could be interconnected in a different order from that shown in FIG. 3A.

It should be noted that in the amplifier 300 the transient termination circuits are located in close physical proximity to the inputs of the transistors encased within the packaged transistor device 302. In this particular embodiment this is accomplished by coupling the first series element (e.g., capacitive element 314) directly to the input trace 304. Furthermore, the resistive element 312, capacitive element 314, and inductive element 316 all may be mounted to the circuit board 303 such that they are completely surrounded by the input trace 304 (or nested within an opening in the input trace 304) at a location in close proximity to the input leads of the packaged transistor device 302. As used herein, "in close proximity", when referring to the proximity of a transient termination circuit (or more specifically a first terminal of a first series element of a transient termination circuit) means within 10 electrical degrees (or no more than 150 mils away) of the input of a transistor, although "in close proximity" alternatively may mean a larger distance, as well. Surrounding these elements with the input trace 304 again provides close proximity between the transient termination circuit and the corresponding transistor input and can thus provide both good transient protection and minimal RF impact. In alternate embodiments, the elements 312, 314, 316 could be only partially surrounded by the input trace 304 (e.g., surrounded on only 3 sides), or the elements 312, 314, 316 could be positioned to one side or the other of the input trace 304 (i.e., disposed next to the input trace 304).

Figure 3B:
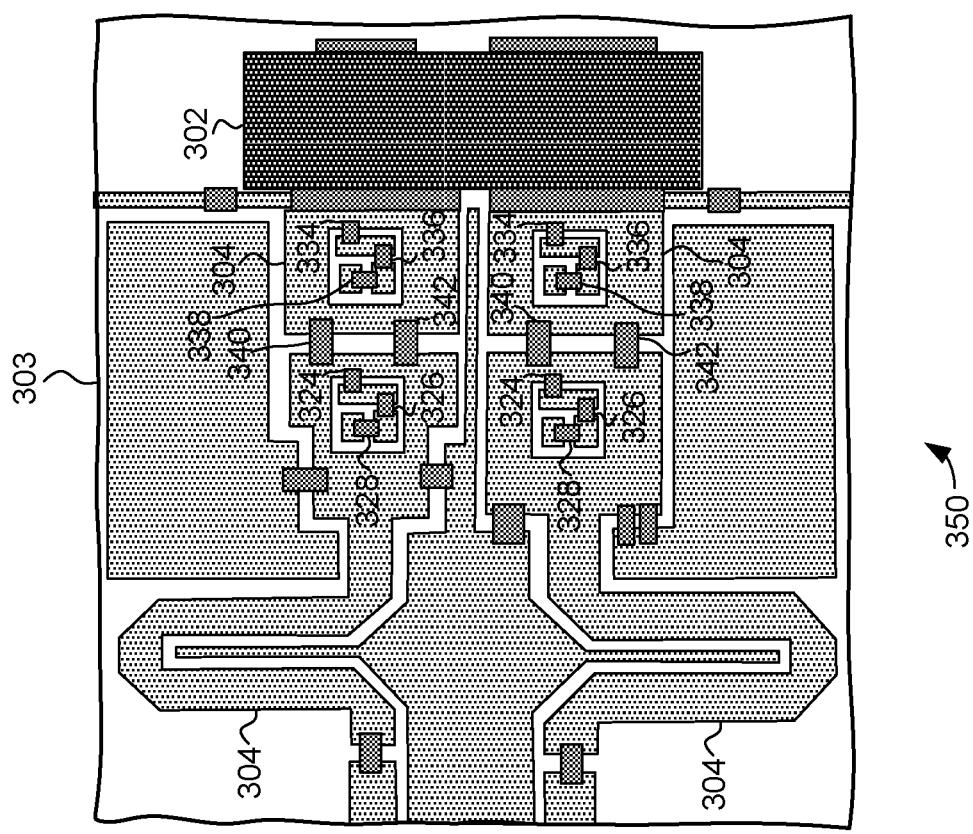

Turning now to FIG. 3B, a top view of a portion of an amplifier 350 is illustrated. The amplifier 350 includes a packaged transistor device 302 mounted to a printed circuit board 303 (PCB). In this embodiment the packaged transistor device 302 includes two encased transistors, two input leads (on the left side of the device 302), and two output leads (on the right side of the device 302. Each encased transistor has its own input (i.e., the two encased transistors are implemented in parallel with each other, each connected between a different input/output lead). The PCB 303 includes a plurality of conductive traces, including two input traces 304. Each of the two input traces 304 provides an electrical connection to the input of a corresponding transistor in the packaged transistor device 302. Specifically, each of the two input traces is coupled to a different input lead of the packaged transistor device 302.

In accordance with the embodiments described herein, a transient termination circuit is coupled to the input of each of the transistors in the packaged transistor device 302. In this embodiment, each of the transient termination circuits is an RLC circuit, and more specifically a Pi-network. In this case, each of the transient termination circuits includes a resistive elements 328, 338, and 340 (e.g., resistive elements 228, 238, and 240), capacitive elements 324 and 334 (e.g., capacitive elements 224 and 234), and inductive elements 326, 336 and 342 (e.g., inductive elements 226, 236, and 242). In this particular embodiment each of the resistive elements 328, 338, and 340, capacitive elements 324 and 334, and inductive element 326, 336 and 342 are formed as separate devices (e.g., surface mount devices) that are mounted to the circuit board 303. More specifically, first and second terminals of each element 328, 338, 340, 324, 334, 326, 336 and 342 are connected (e.g., soldered or conductively adhered) to conductive traces on the top surface of circuit board 303, and one of the conductive traces is coupled to a ground reference node (e.g., ground 210) at a bottom surface of the circuit board 303 through conductive vias that extend between the top and bottom surfaces of the circuit board 303. Accordingly, the elements 328, 324, 326 are connected in series between conductive trace 304 and the ground reference node. Likewise, the elements 334, 336, 338 are connected in series between conductive trace 304 and the ground reference node. However, in other embodiments one or more of these elements could be made from conductive traces or in some other manner. Further, the various resistive, capacitive, and inductive elements could be interconnected in a different order from that shown in FIG. 3B.

It should be noted that in the amplifier 350 the transient termination circuits are again located in close physical proximity to the inputs of the transistors encased within the packaged transistor device 302. In this particular embodiment this is accomplished by coupling the first series element for one leg or branch (e.g., capacitive elements 324) directly to a portion of the input trace 304. Likewise the first series element for the other leg or branch (e.g., capacitive element 334) is coupled directly to a second portion of the input trace 304. Furthermore, the resistive elements 328, 338, capacitive elements 324, 334, and inductive elements 326, 336 all may be mounted to the circuit board 303 such that they are completely surrounded by a portion of the input trace 304 (or nested within an opening in the input trace 304) at a location in close proximity to the input leads of the packaged transistor device 302. Surrounding these elements with the input trace 304 again provides close proximity between the transient termination circuit and the corresponding transistor input and can thus provide both good transient protection and minimal RF impact. In alternate embodiments, the elements 328, 338, 324, 334, 326, 336 could be only partially surrounded by the input trace 304 (e.g., surrounded on only 3 sides), or could be positioned to one side or the other of the input trace 304 (i.e., disposed next to the input trace 304).

It should be again be noted that the amplifiers 300 and 350 are just two example implementations, and that other implementations are possible. For example, in some cases one or more elements of the transient termination circuits can be packaged with the transistors in the device package 302. In such embodiments these elements of the transient termination circuits can be formed on a separate die, such as an IPD die, and then packaged in the same package as the transistor dies. Inductive elements could be formed from wirebonds, or in/on IPDs. In other embodiments these elements of the transient termination circuits could be integrated within and/or connected to the same die as the transistor. The terms "package", "packaged device", and "packaged transistor device", as used herein means a collection of structural components (e.g., including a conductive flange and/or other package substrate) to which the primary electrical components (e.g., input and output leads, transistor dies, IPD dies, and various electrical interconnections) are coupled and/or encased. The package, packaged device, or packaged transistor device is thus a distinct discrete device that may be mounted to a printed circuit board (PCB) or other substrate that includes other devices and portions of a circuit. As specific examples, the package, packaged device, or packaged transistor device can comprise an air cavity or overmolded package having a suitable package substrate, input lead(s), and output lead(s). In addition, the package, packaged device, or packaged transistor device could be implemented using other packaging configurations than those shown in the figures, such as but not limited to no-leads packages (e.g., quad flat no-leads, QFN), or other package types.

Figure 4:
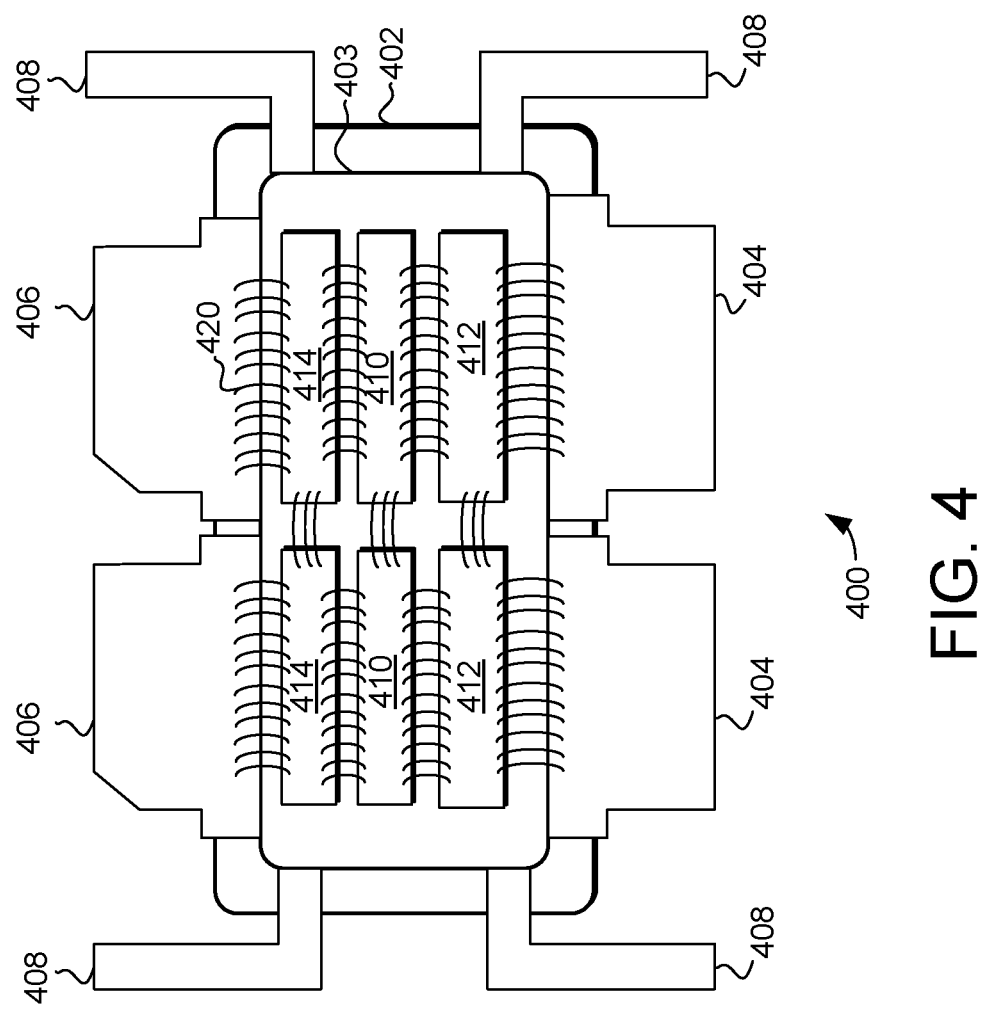
FIG. 4 is a top view of a packaged amplifier device in accordance with an example embodiment.

Turning now to FIG. 4, a top view of a portion of an exemplary amplifier 400 that is implemented within a discrete device package 402 is illustrated. The package 402 includes a package substrate 403, input leads 404, output leads 406 and biasing leads 408. The package substrate 403 (e.g., flange or other substrate with a conductive top surface that serves as a ground plane) to which various semiconductor dies are mounted or otherwise connected. The package 402 also may include an isolator that electrically isolates the package substrate or flange from the leads 404, 406 and 408, or alternatively may include encapsulation that provides such electrical isolation. The package 402 may be an air-cavity package or a plastic encapsulated (overmolded) package.

In this example, amplifier 400 implements two amplification paths, with each amplification path including an input IPD die 412, a transistor die 410, and an output IPD die 414, all encased together in one package 402. Each transistor die 410 can include one ore more integrated transistors (e.g., silicon-based or III-V-based FETs). In one embodiment in which the amplifier 400 forms a portion of a Doherty amplifier (as described in more detail in conjunction with FIG. 5), one of the transistor dies 410 can include a carrier transistor, and the other transistor die 410 can include one or more peaking transistors, with each transistor formed on a corresponding semiconductor die. Likewise, in some embodiments input matching network components can be implemented on the input IPD dies 412, and output matching network components can be implemented on the output IPD dies 414.

In this implementation the input leads 404 are each configured to receive an RF signal (e.g., from a signal divider that is implemented on a PCB to which the package 402 is coupled), and bond wire arrays 420, which may form portions of the input matching components, couple the input leads 404 to input IPD dies 412. Likewise, various bond wire arrays 420, which may form other portions of the input and output matching components, connect the elements inside the package, and connect the output IPD dies 414 to the output leads 406.

In accordance with the embodiments described herein, one or more components of transient termination circuits (e.g., transient termination circuits 106, 200, 220) are included inside the package 402. For example, various resistive, capacitive and inductive elements can be integrated within or formed on the input IPD dies 412. Furthermore, various discrete devices can be additionally included inside the package 402. Finally, in some embodiments inductive elements can be provided with the bond wire arrays 420.

Again it should be noted that in any off these embodiments of amplifier 400 the elements of the transient termination circuits are located in close physical proximity to the transistor inputs, and thus can provide the desired high frequency performance.

As was described, in some implementations the transient termination circuits described above can be included in Doherty amplifiers. In general, a Doherty amplifier divides an input RF signal and uses amplifiers of different classes to amplify the divided parts of the RF signal. Specifically, a Doherty amplifier typically uses a carrier amplifier and one or more peaking amplifiers, with the carrier amplifier used to amplify relatively low power input signals, and both the carrier amplifier and the one or more peaking amplifiers used to drive relatively high power input signals (e.g., the peaks of the signal). In such an implementation, the carrier amplifier is typically biased to operate as a class AB driver, and the peaking amplifier(s) are biased to operate as class C drivers.

In such an embodiment, the carrier amplifier can comprise one or more transistors (e.g., including a driver transistor and a final stage transistor, or just a final stage transistor), and the peaking amplifier can comprise one or more other transistors (e.g., including a driver transistor and a final stage transistor, or just a final stage transistor). Thus, single stage (e.g., single transistor) carrier and peaking amplifiers can be used in some embodiments, and other embodiments can include multiple-stage amplifiers (e.g., in which each amplification path includes a driver amplifier (transistor) and a final-stage amplifier (transistor) coupled in series).

In a typical Doherty implementation, when the input RF signal is at relatively low signal levels, the carrier amplifier operates near its compression point and thus with high efficiency, while the peaking amplifier(s) are not operating. Thus, at relatively low signal levels the Doherty amplifier can provide both high efficiency and good linearity. Then, when higher signal levels occur, the carrier amplifier compresses, and one or more of the peaking amplifier(s) start to operate to "top up" the resulting output signal. Thus, the peaking amplifier(s) provide the ability to achieve high power output during times of high input signal levels. Thus, the carrier and peaking amplifiers of the Doherty amplifier together can provide relatively high power output and high efficiency. Stated another way, Doherty amplifiers thus can combine class AB and class C amplifiers in a way that maintains linearity while providing high power efficiency, and can further provide a high power output.

Figure 5:
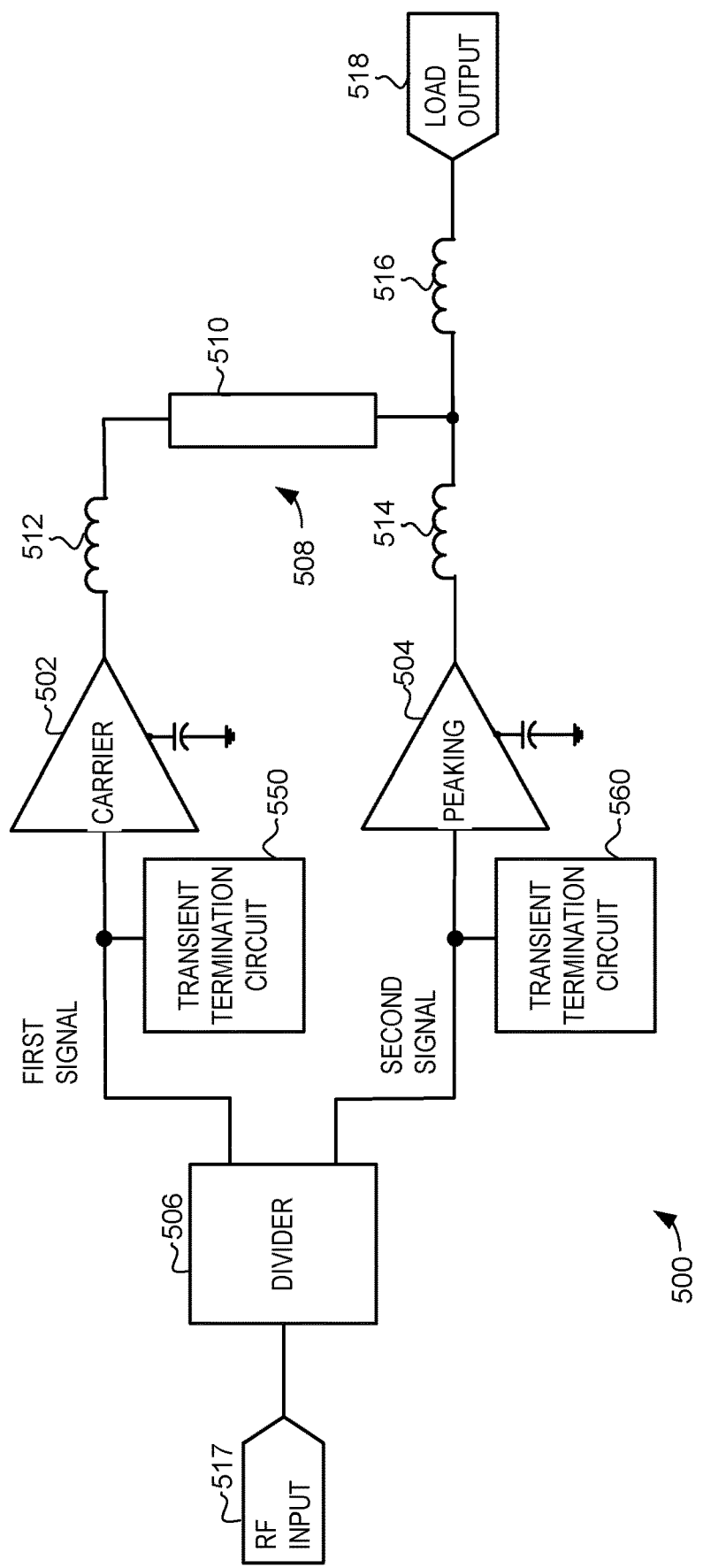
FIG. 5 is a schematic diagram of a Doherty amplifier in accordance with an example embodiment.

Turning now to FIG. 5, a circuit diagram representing a portion of an exemplary amplifier 500 is illustrated. In this illustrated embodiment, the amplifier 500 is a Doherty amplifier that receives an RF input signal at the RF input 517 and drives an amplified signal to a load output 518. The amplifier 500 includes a carrier amplifier 502, a peaking amplifier 504, a divider 506, a combiner 508, a first transient termination circuit 550, and a second transient termination circuit 560.

In a typical embodiment, the divider 506 receives an RF signal and generates two output signals that are 90 degrees out of phase with each other. These two outputs correspond to the first signal and second signal that are applied to the carrier amplifier 502 and peaking amplifier 504 respectively. The two outputs can be in the form of equal-power or unequal-power signals. The 90 degree phase difference can be provided by a phase delay element that applies a phase shift of about 90 degrees to the second signal before outputting the second signal to the peaking amplifier 504. The 90 degree difference in phase allows the output of the peaking amplifier 504 to be in step with the carrier amplifier 502 output when combined by the combiner 508.

The amplifier 500 receives and amplifies the first signal and the phase delayed second signal, combines the amplified first and second signals in phase, and drives the combined signal to a load output 518. The carrier amplifier 502 includes one or more carrier transistors, and the peaking amplifier 504 includes one or more peaking transistors, and the outputs of the carrier and peaking transistors are coupled to combiner 508. Conceptually, the combiner 508 can be considered to include a ¼ wave transformer 510 and inductances 512 and 514. This combiner 508 serves to the combine the outputs of the carrier amplifier 502 and peaking amplifier 504 such that the combined output can be delivered to the load output 518. To facilitate this, the combiner 508 is coupled to the load output 518 through inductance 516. The ¼ wave transformer 510 of the combiner 508 provides a 90 degree phase shift to the output of the carrier amplifier 502 and thus facilitates the in-phase combining of that output with the output of the peaking amplifier 504. The combiner 508 also provides an impedance inversion between the outputs of the carrier amplifier 502 and the peaking amplifier 504. During operation, the impedance inverter effectively changes the impedance seen by the carrier amplifier 502 to provide an optimal load to the carrier amplifier 502 at and around the operational frequency. The inductances 512 and 514 in the combiner 508 can be provided by bond wire arrays used to couple the amplifiers 502 and 504 to a combining node (between inductances 514, 516). Likewise, the inductance 516 can be provided by a bond wire array used to couple the combining node to a package lead.

In a typical Doherty implementation, the carrier amplifier 502 is biased to operate as a class AB amplifier, and is used to drive the main body of the output signal. Conversely, the peaking amplifier 504 is biased to operate as a class C amplifier, and is used to drive the peaks of the output signal. This use of the two amplifiers 502 and 504 as class AB and class C amplifiers with outputs that are combined together can provide both relatively high power output and high efficiency.

In a typical embodiment, the carrier amplifier 502 and peaking amplifier 504 would be implemented with suitable RF-capable transistors with relatively high power capability. For example, the carrier amplifier 502 and peaking amplifier 504 can be implemented with III-V type transistors (e.g., Gallium Nitride (GaN) transistors), silicon-based transistors (e.g., LDMOS FETs), or other types of transistors.

In accordance with the embodiments described herein, the Doherty amplifier 500 includes a first transient termination circuit 550 and a second transient termination circuit 560. The transient termination circuit 550 (e.g., circuit 160, 200, 220) is coupled to an input of a transistor in the carrier amplifier 502. Likewise, the transient termination circuit 560 (e.g., circuit 160, 200, 220) is coupled to an input of a transistor in a peaking amplifier 504. Again, each of these transient termination circuits 550, 560 is configured to reduce the transient response of certain transient signals while still allowing for high frequency, high power amplification. Such a reduction in the transient response can be accomplished by increasing the time constant applicable to those signals. However, the transient termination circuits 550, 560 can also be configured not to significantly increase the time constant for signal energy at frequencies near the fundamental frequency and thus not interfere with high frequency operation of the Doherty amplifier 500. Thus, in such a configuration the transient termination circuits 550, 560 can reduce the unwanted effects of transient signals while still providing for high frequency, high power amplification.

Figure 6B:
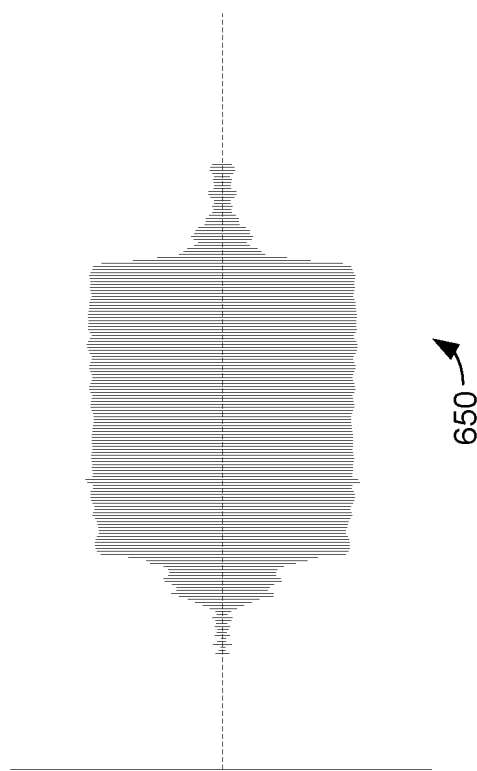
FIGS. 6A and 6B are graphs of exemplary amplified RF signals.
Figure 6A:
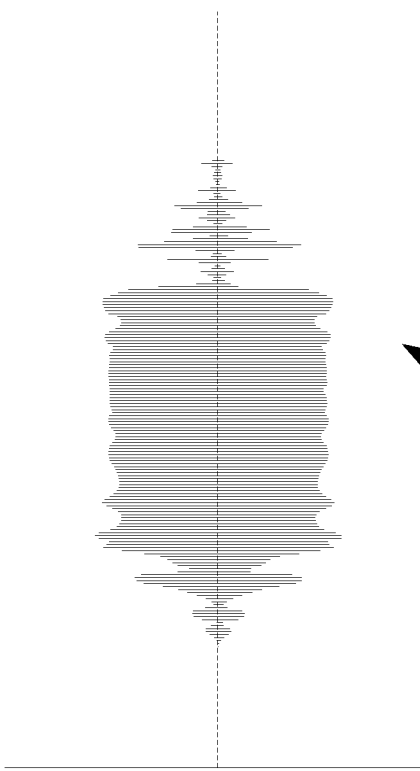

Turning now to FIGS. 6A and 6B, graphs 600 and 650 show exemplary amplified RF signals, where the amplified RF signals are specifically amplitude modulated carrier signals. These amplitude modulated carrier signals have a fundamental frequency ($f_O$) and can be modulated at frequencies components that will interact with the device's operational baseband frequency ($f_B$). More specifically, these amplitude modulated carrier signals are pulse modulated, and thus may have large transient spikes associated with the leading edge and trailing edge of each pulse modulation. These amplitude modulated carrier signals are exemplary of the type of RF signals that can be generated by a high frequency RF amplifier in many typical applications.

Graph 600 shows exemplary effects of these large transient spikes in a typical RF amplifier that does not include a transient termination circuit. As can be seen by comparing these graphs 600, 650, the transient spikes cause considerable undesirable signal noise that is evident in graph 600. Specifically, there is considerable signal noise corresponding to the leading edge of the pulse and trailing edge of the pulse. In both instances this signal noise is due at least in part to the transient response of the amplifier.

Graph 650 shows the exemplary effects of these large transient spikes in an amplifier includes a transient termination circuit in accordance with the embodiments described herein. In graph 650 the resulting signal noise following both the leading edge and trailing edge of the pulse is significantly reduced, when compared with graph 600. This cleaner signal results can provide ruggedness improvements by maintaining the transistor within safe functional limits. Furthermore, this cleaner signal can improve linearity of the amplifier. Thus, it can be seen implementation of an embodiment of a transient termination circuit can reduce the negative effects of transient signals in an amplifier while maintaining good frequency response for the carrier signals at the fundamental frequency.

In one embodiment a radio frequency (RF) amplifier configured to amplify signals having a fundamental frequency ($f_O$) and a baseband frequency ($f_B$), is provided, the RF amplifier comprising: a first transistor, wherein the first transistor includes a first transistor input and a first transistor output; a first transient termination circuit coupled to the first transistor input, the first transient termination circuit configured to reduce a transient response at the first transistor input by increasing a time constant at the first transistor input by at least a factor of 2 for at least some signal energy at frequencies below the baseband frequency ($f_B$) while not increasing the time constant at the first transistor input by at least a factor of 2 for signal energy at the fundamental frequency ($f_O$); and a first input matching network coupled to the first transient termination circuit.

In another embodiment, a Doherty radio frequency (RF) amplifier configured to amplify RF signals having a fundamental frequency ($f_O$) and a baseband frequency ($f_B$), is provided, the RF amplifier comprising: a divider configured to receive the RF signals; a first transistor coupled to the divider, wherein the first transistor includes a first transistor input and a first transistor output, wherein the first transistor is a carrier amplifier in the Doherty RF amplifier; a first transient termination circuit coupled to the first transistor input, the first transient termination circuit configured to reduce a transient response at the first transistor input by increasing a time constant at the first transistor input by at least a factor of 2 for at least some signal energy at frequencies below the baseband frequency ($f_B$) while not increasing the time constant at the first transistor input by at least a factor of 2 for signal energy at the fundamental frequency ($f_O$); a second transistor coupled to the divider, wherein the second transistor includes a second transistor input and a second transistor output, and wherein the second transistor is a peaking amplifier in the Doherty RF amplifier; a second transient termination circuit coupled to the second transistor input, the second transient termination circuit configured to reduce a transient response at the second transistor input by increasing a time constant at the second transistor input by at least a factor of 2 for at least some signal energy at frequencies below the baseband frequency ($f_B$) while not increasing the time constant at the second transistor input by at least a factor of 2 for signal energy at the fundamental frequency ($f_0$); and a combiner, the combiner coupled to the first transistor output and the second transistor output.

In another embodiment, a radio frequency (RF) amplifier configured to amplify signals having a fundamental frequency ($f_0$) and a baseband frequency ($f_B$), is provided, the RF amplifier comprising: a first transistor, wherein the first transistor includes a first transistor input and a first transistor output, wherein the first transistor is formed on a first transistor die, and wherein the first transistor die is encased in a device package that includes at least a first input lead and a first output lead; a circuit board, wherein the device package is mounted on the circuit board, and wherein the circuit board includes an input trace coupled to the first input lead; a first transient termination circuit coupled to the first transistor input, the first transient termination circuit configured to reduce a transient response at the first transistor input by increasing a time constant at the first transistor input by at least a factor of 2 for at least signal energy at frequencies between 0.333 of the baseband frequency ($f_B$) and the baseband frequency ($f_B$) while not increasing the time constant at the first transistor input by at least a factor of 2 for signal energy at the fundamental frequency ($f_0$), wherein the first transient termination circuit includes at least a first inductance and a first capacitance, and wherein the first inductance and the first capacitance are coupled to the first input trace on the circuit board; and a first input matching network coupled to the first transient termination circuit.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Furthermore the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier configured to amplify signals having a fundamental frequency ($f_0$) and a baseband frequency ($f_B$), the RF amplifier comprising:
    a first transistor, wherein the first transistor includes a first transistor input and a first transistor output;
    a first transient termination circuit coupled to the first transistor input, wherein the first transient termination circuit comprises a $2^{nd}$ order low pass equivalent circuit, and the first transient termination circuit is configured to reduce a transient response at the first transistor input by increasing a time constant at the first transistor input by at least a factor of 2 for at least some signal energy at frequencies below the baseband frequency ($f_B$) while not increasing the time constant at the first transistor input by at least a factor of 2 for signal energy at the fundamental frequency ($f_0$); and
    a first input matching network coupled to the first transient termination circuit.

2. The RF amplifier of claim 1, wherein the first transient termination circuit comprises a half-T network, where the half-T network is tuned to increase the time constant at the first transistor input.

3. The RF amplifier of claim 1, wherein the first transient termination circuit is configured to reduce the transient response at the first transistor input by increasing the time constant at the first transistor input by at least a factor of 7 for at least some signal energy at frequencies below the baseband frequency ($f_B$) while not increasing the time constant at the first transistor input by at least a factor of 2 for signal energy at the fundamental frequency ($f_0$).

4. The RF amplifier of claim 1, wherein the first transistor is formed on a first transistor die, and wherein the first transistor die is encased in a device package that includes at least a first input lead and a first output lead.

5. The RF amplifier of claim 4, wherein the first transient termination circuit includes at least a first inductance and a first capacitance, and wherein the first inductance is formed on a first integrated passive device (IPD) die and wherein the first capacitance is formed on the first IPD die, and wherein the first IPD die is encased in the device package with the first transistor die.

6. The RF amplifier of claim 4, wherein the first transient termination circuit includes at least a first inductance and a first capacitance, and wherein the first inductance and the first capacitance are coupled to a first input trace on a circuit board, where the first input trace is coupled to the first input lead.

7. The RF amplifier of claim 6, wherein the first inductance and the first capacitance are at least partially surrounded by a portion of the first input trace on the circuit board.

8. The RF amplifier of claim 1, wherein the RF amplifier comprises a Doherty amplifier, and wherein the first transistor is a carrier transistor in the Doherty amplifier, and wherein the RF amplifier further comprises:
a second transistor, wherein the second transistor is a peaking transistor in the Doherty amplifier, and wherein the second transistor includes a second transistor input and a second transistor output;
a second transient termination circuit coupled to the second transistor input, the second transient termination circuit configured to reduce a transient response at the second transistor input by increasing a time constant at the second transistor input by at least a factor of 2 for at least some signal energy at frequencies below the baseband frequency ($f_B$) while not increasing the time constant at the second transistor input by at least a factor of 2 for signal energy at the fundamental frequency ($f_0$); and
a second input matching network coupled to the second termination circuit.

9. The RF amplifier of claim 1, wherein:
the first transistor is formed on a first transistor die;
the first transistor die is encased in a device package that includes at least a first input lead and a first output lead;
the first input trace is coupled to the first input lead;
the first transient termination circuit includes at least a first inductance and a first capacitance; and
the first inductance and the first capacitance are coupled to a first input trace on a circuit board, and the first inductance and the first capacitance are surrounded on at least 3 sides by a portion of the first input trace on the circuit board.

10. A radio frequency (RF) amplifier configured to amplify signals having a fundamental frequency ($f_0$) and a baseband frequency ($f_B$), the RF amplifier comprising:
a first transistor, wherein the first transistor includes a first transistor input and a first transistor output;
a first transient termination circuit coupled to the first transistor input, wherein the first transient termination circuit comprises a Pi-network having a plurality of branches, where each branch of the plurality of branches is tuned to increase the time constant at the first transistor input, and the first transient termination circuit is configured to reduce a transient response at the first transistor input by increasing a time constant at the first transistor input by at least a factor of 2 for at least some signal energy at frequencies below the baseband frequency ($f_B$) while not increasing the time constant at the first transistor input by at least a factor of 2 for signal energy at the fundamental frequency ($f_0$), and
a first input matching network coupled to the first transient termination circuit.

11. The RF amplifier of claim 10, wherein:
the first transistor is formed on a first transistor die;
the first transistor die is encased in a device package that includes at least a first input lead and a first output lead;
the first input trace is coupled to the first input lead;
the first transient termination circuit includes at least a first inductance and a first capacitance; and
the first inductance and the first capacitance are coupled to a first input trace on a circuit board, and the first inductance and the first capacitance are surrounded on at least 3 sides by a portion of the first input trace on the circuit board.

12. A Doherty radio frequency (RF) amplifier configured to amplify RF signals having a fundamental frequency ($f_0$) and a baseband frequency ($f_B$), the RF amplifier comprising:
a divider configured to receive the RF signals;
a first transistor coupled to the divider, wherein the first transistor includes a first transistor input and a first transistor output, wherein the first transistor is a carrier amplifier in the Doherty RF amplifier;
a first transient termination circuit coupled to the first transistor input, wherein the first transient termination circuit comprises a first $2^{nd}$ order low pass equivalent circuit, and the first transient termination circuit is configured to reduce a transient response at the first transistor input by increasing a time constant at the first transistor input by at least a factor of 2 for at least some signal energy at frequencies below the baseband frequency ($f_B$) while not increasing the time constant at the first transistor input by at least a factor of 2 for signal energy at the fundamental frequency ($f_0$);
a second transistor coupled to the divider, wherein the second transistor includes a second transistor input and a second transistor output, and wherein the second transistor is a peaking amplifier in the Doherty RF amplifier;
a second transient termination circuit coupled to the second transistor input, wherein the second transient termination circuit comprises a second $2^{nd}$ order low pass equivalent circuit, and the second transient termination circuit is configured to reduce a transient response at the second transistor input by increasing a time constant at the second transistor input by at least a factor of 2 for at least some signal energy at frequencies below the baseband frequency ($f_B$) while not increasing the time constant at the second transistor input by at least a factor of 2 for signal energy at the fundamental frequency ($f_0$); and
a combiner, the combiner coupled to the first transistor output and the second transistor output.

13. The Doherty RF amplifier of claim 12, wherein the first transient termination circuit comprises a first half-T network, where the first half-T network is tuned to increase the time constant at the first transistor input, and wherein the second transient termination circuit comprises a second half-T network, where the second half-T network is tuned to increase the time constant at the second transistor input.

14. The Doherty RF amplifier of claim 12, wherein the first transient termination circuit is configured to reduce the transient response at the first transistor input by increasing the time constant at the first transistor input by at least a factor of 7 for at least some signal energy at frequencies below the baseband frequency ($f_B$) while not increasing the time constant at the first transistor input by at least a factor of 2 for signal energy at the fundamental frequency ($f_0$).

15. The Doherty RF amplifier of claim 12, wherein the first transistor is formed on a first transistor die, and wherein the first transistor die is encased in a device package that includes at least a first input lead and a first output lead.

16. The Doherty RF amplifier of claim 15, wherein the first transient termination circuit includes at least a first inductance and a first capacitance, and wherein the first inductance is formed on a first integrated passive device (IPD) die and wherein the first capacitance is formed on the first IPD die, and wherein the first IPD die is encased in the device package with the first transistor die.

17. The Doherty RF amplifier of claim 15, wherein the first transient termination circuit includes at least a first inductance and a first capacitance, and wherein the first inductance and the first capacitance are coupled to a first input trace on a circuit board, where the first input trace is coupled to the first input lead.

18. The Doherty RF amplifier of claim 17, wherein the first inductance and the first capacitance are at least partially surrounded by a portion of the first input trace on the circuit board.

19. A Doherty radio frequency (RF) amplifier configured to amplify RF signals having a fundamental frequency ($f_0$) and a baseband frequency ($f_B$), the RF amplifier comprising:
   a divider configured to receive the RF signals;
   a first transistor coupled to the divider, wherein the first transistor includes a first transistor input and a first transistor output, wherein the first transistor is a carrier amplifier in the Doherty RF amplifier;
   a first transient termination circuit coupled to the first transistor input, wherein the first transient termination circuit comprises first a Pi-network having a first plurality of branches, where each branch of the first plurality of branches is tuned to increase the time constant at the first transistor input, and the first transient termination circuit is configured to reduce a transient response at the first transistor input by increasing a time constant at the first transistor input by at least a factor of 2 for at least some signal energy at frequencies below the baseband frequency ($f_B$) while not increasing the time constant at the first transistor input by at least a factor of 2 for signal energy at the fundamental frequency ($f_0$);
   a second transistor coupled to the divider, wherein the second transistor includes a second transistor input and a second transistor output, and wherein the second transistor is a peaking amplifier in the Doherty RF amplifier;
   a second transient termination circuit coupled to the second transistor input, wherein the second transient termination circuit comprises a second Pi-network having a second plurality of branches, where each branch of the second plurality of branches is tuned to increase the time constant at the second transistor input, and the second transient termination circuit is configured to reduce a transient response at the second transistor input by increasing a time constant at the second transistor input by at least a factor of 2 for at least some signal energy at frequencies below the baseband frequency ($f_B$) while not increasing the time constant at the second transistor input by at least a factor of 2 for signal energy at the fundamental frequency ($f_0$); and
   a combiner, the combiner coupled to the first transistor output and the second transistor output.

20. A radio frequency (RF) amplifier configured to amplify signals having a fundamental frequency ($f_0$) and a baseband frequency ($f_B$), the RF amplifier comprising:
   a first transistor, wherein the first transistor includes a first transistor input and a first transistor output, wherein the first transistor is formed on a first transistor die, and wherein the first transistor die is encased in a device package that includes at least a first input lead and a first output lead;
   a circuit board, wherein the device package is mounted on the circuit board, and wherein the circuit board includes an input trace coupled to the first input lead;
   a first transient termination circuit coupled to the first transistor input, the first transient termination circuit configured to reduce a transient response at the first transistor input by increasing a time constant at the first transistor input by at least a factor of 2 for at least signal energy at frequencies between 0.333 of the baseband frequency ($f_B$) and the baseband frequency ($f_B$) while not increasing the time constant at the first transistor input by at least a factor of 2 for signal energy at the fundamental frequency ($f_0$), wherein the first transient termination circuit includes at least a first inductance and a first capacitance, and wherein the first inductance and the first capacitance are coupled to the first input trace on the circuit board; and
   a first input matching network coupled to the first transient termination circuit.

* * * * *